(12) United States Patent
Harris

(10) Patent No.: US 8,537,657 B2
(45) Date of Patent: Sep. 17, 2013

(54) CROSS DOMAIN MODULATION SCHEME FOR A WIRELESS COMMUNICATION LINK

(75) Inventor: Mark A. Harris, Clearwater, FL (US)

(73) Assignee: Raytheon Company, Waltham, MA (US)

( * ) Notice: Subject to any disclaimer, the term of this patent is extended or adjusted under 35 U.S.C. 154(b) by 402 days.

(21) Appl. No.: 12/839,885

(22) Filed: Jul. 20, 2010

(65) Prior Publication Data

US 2011/0019630 A1     Jan. 27, 2011

Related U.S. Application Data

(60) Provisional application No. 61/228,422, filed on Jul. 24, 2009.

(51) Int. Cl.
*H04J 11/00* (2006.01)

(52) U.S. Cl.
USPC .......................................... 370/204; 375/279

(58) Field of Classification Search
USPC .......... 370/203, 204, 208–210; 375/259–285
See application file for complete search history.

(56) References Cited

U.S. PATENT DOCUMENTS

| | | | | |
|---|---|---|---|---|
| 4,295,140 A | 10/1981 | Brockman | ............... | 343/100 |
| 4,839,615 A * | 6/1989 | Sato | ............... | 332/117 |
| 5,592,177 A | 1/1997 | Barrett | | |
| 5,943,372 A * | 8/1999 | Gans et al. | ............... | 370/208 |
| 6,205,185 B1 | 3/2001 | Kajiwara | ............... | 375/316 |
| 2004/0243258 A1* | 12/2004 | Shattil | ............... | 700/73 |
| 2005/0069066 A1* | 3/2005 | Meyer et al. | ............... | 375/353 |

FOREIGN PATENT DOCUMENTS

EP    1 939 979 A1    7/2008

OTHER PUBLICATIONS

M. G. Pelchat, *The Autocorrelation Function and Power Spectral Density of PCM/FM with Random Binary Modulation Waveforms*, IEEE Transactions on Space Electronics and Telemetry, vol. 10, Issue 1, pp. 39-44, Mar. 1964.

PCT, Notification of Transmittal of the International Search Report and the Written Opinion of the International Searching Authority, or the Declaration, International Application No. PCT/US2010/042981, Int'l filing date Jul. 23, 2010 (11 pages), Mailing Date Dec. 10, 2010.

* cited by examiner

*Primary Examiner* — Pao Sinkantarakorn
(74) *Attorney, Agent, or Firm* — Daly, Crowley, Mofford & Durkee, LLP

(57) ABSTRACT

In certain embodiments, a wireless communication link includes a wireless receiver that receives a circular polarized signal from a remotely configured transmitter. The circular polarized signal has a polarization vector that rotates at a radial velocity. The wireless receiver determines a phase deviation in the radial velocity of the polarization vector and demodulates information from the circular polarized signal according to the determined phase deviation. The phase deviation is caused by a frequency deviation of the circular polarized signal generated by the transmitter.

17 Claims, 3 Drawing Sheets

US 8,537,657 B2

CROSS DOMAIN MODULATION SCHEME FOR A WIRELESS COMMUNICATION LINK

RELATED APPLICATIONS

This application claims the benefit under 35 U.S.C. §119(e) of the priority of U.S. Provisional Patent Application Ser. No. 61/228,422, entitled "Cross Domain Modulation Scheme For a Communication Link," filed Jul. 24, 2009, the entire disclosure of which is hereby incorporated by reference.

TECHNICAL FIELD OF THE DISCLOSURE

This disclosure generally relates to wireless communications, and more particularly, to a cross domain modulation scheme for a wireless communication link.

BACKGROUND

Limited bandwidth in portions of the electro-magnetic spectrum remains a challenge in wireless communications. In general, data transfer rates of approximately 3 to 5 bits-per-second-per-Hertz (bits/second/Hertz) can be achieved using conventional modulation schemes with high-order alphabets of approximately several bits-per-symbol. These modulation schemes often require sophisticated modems to correctly detect data in the presence of noise and other interference sources. Many newer modulation schemes such as quadrature amplitude modulation (QAM) combine amplitude and phase modulation, often using inefficient linear power amplifiers to prevent signal distortion. In addition, available spectral bandwidth is in many cases limited and highly regulated. For applications using beyond line-of-sight communications such as satellite links, bandwidth allocations may be particularly limited and valuable.

SUMMARY

In accordance with the present disclosure, disadvantages and problems associated with previous and existing wireless communication techniques may be reduced or eliminated.

In certain embodiments, a wireless communication link includes a wireless receiver that receives a circular polarized signal from a remotely configured transmitter. The circular polarized signal has a polarization vector that rotates at a radial velocity. The wireless receiver determines a phase deviation in the radial velocity of the polarization vector and demodulates information from the circular polarized signal according to the determined phase deviation. The phase deviation is caused by a frequency deviation of the circular polarized signal generated by the transmitter.

Certain embodiments of the present disclosure may provide one or more technical advantages. For example, certain embodiments may provide enhanced information density over communication links that use modulation schemes such as amplitude modulation (AM), frequency modulation (FM), or phase modulation (PM). Typically, modulation schemes such as these may provide information densities on the order to 1 to 3 bits/second/Hertz. Certain embodiments of the present disclosure, on the other hand, may provide information densities of approximately 200 bits/second/Hertz while using a relatively narrow band wireless signal. In some cases in which modulated information yields multiple rotations of the polarization vector, information densities up to 1000 bits/second/Hertz may be achieved. Thus, the data bandwidth of communication links such as satellite links, may be enhanced to transfer relatively larger amounts of information than may be typically provided by conventional modulation schemes. The enhanced information densities provided by certain embodiments may also enable additional bandwidth for enhanced coding schemes such as error correction and/or encryption that, in some cases, may provide enhanced reliability and/or security, respectively, for the communication link.

Certain embodiments of the present disclosure may use a relatively narrow band signal to transfer relatively large amounts of information. Because phase deviations may be relatively large when the distance between transmitter and receiver is large, the frequency deviation at the transmitter may be relatively small compared to the phase deviation at the receiver. In some cases, frequency deviations as low as 0.003 percent may be used to modulate information on the wireless signal, yielding a narrow band signal that consumes relatively little bandwidth in the electro-magnetic spectrum.

Certain embodiments of the present disclosure may provide some, all, or none of these advantages. Certain embodiments may provide one or more other technical advantages, one or more of which may be readily apparent to those skilled in the art from the figures, descriptions, and claims included herein.

BRIEF DESCRIPTION OF THE DRAWINGS

To provide a more complete understanding of embodiments of the present disclosure and the features and advantages thereof, reference is made to the following description taken in conjunction with the accompanying drawings, in which.

DESCRIPTION OF EXAMPLE EMBODIMENTS

Figure 1:
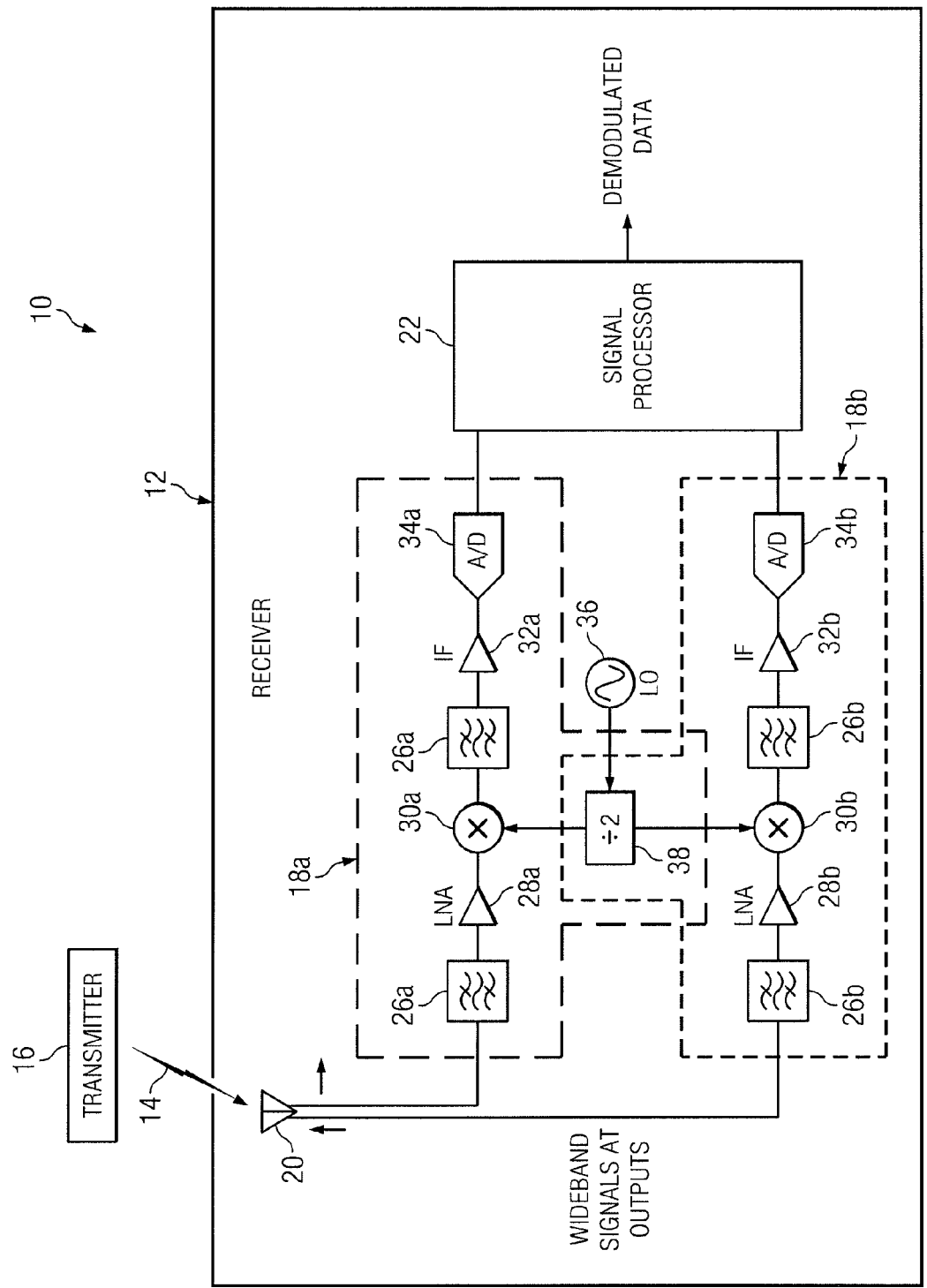
FIG. 1 illustrates an example communication system for providing a cross domain modulation scheme for a communication link according to certain embodiments of the present disclosure.

FIG. 1 illustrates an example communication system 10 for providing a cross domain modulation scheme for a communication link according to the teachings of the present disclosure. Communication system 10 includes a receiver 12 operable to receive a circular polarized signal 14 from a remote transmitter 16. Transmitter 16 modulates information onto circular polarized signal 14 using frequency modulation. Transmitter 16 and receiver 12 implement a cross domain modulation scheme by modulating information onto circular polarized signal 14 using a frequency modulation technique, such as a narrowband frequency modulation, while receiver 12 recovers the modulated information using a phase deviation of the radial velocity in the polarization vector of the received circular polarized signal 14.

Wireless communications typically occur by transmitting a signal to a receiver that detects and demodulates a data stream that has been modulated onto the signal. Amplitude modulation (AM) occurs by varying the amplitude of the signal in a pattern representing the input data; however, this modulation technique may be generally sensitive to noise and interference. Constant envelope modulation overcomes the amplitude sensitivity and typically occurs by modifying the frequency of the source by small amounts using frequency modulation (FM). Variations of the amount and rate of frequency change permit the various forms of frequency modulation and phase modulation (PM). Modulation techniques that combine amplitude and phase modulation also exist. These modulation schemes typically provide transfer densities versus bandwidth in the region of 1 to 3 bits-per-second-per-Hertz (bits/s/Hz). Thus, high data rate signals may require wide frequency bandwidths to transfer the information using conventional modulation techniques, such AM, FM, PM, or any combination thereof.

Certain embodiments of the present disclosure may provide one or more technical advantages. For example, certain embodiments of communication system 10 may provide enhanced information density over conventional communication links that use modulation schemes, such as AM, FM, PM, or any combination thereof. Modulation schemes such as these may provide information densities on the order to 1 to 3 bits/second/Hertz. Certain embodiments of communication system 10 according to the present disclosure, on the other hand, may provide information densities of approximately 200 bits/second/Hertz while using a relatively narrow band wireless signal. In some cases in which modulated information yields multiple rotations of the polarization vector, information densities up to 1000 bits/second/Hertz may be achieved. Thus, the data bandwidth of communication links, such as satellite links, may be enhanced to transfer relatively larger amounts of information than may be typically provided by conventional modulation schemes.

Certain embodiments of the communication system 10 may provide an advantage in that a relatively constant amplitude waveform may be transmitted so that nonlinear high efficiency power amplifiers may be used with communication system 10. Additionally, over-the-air bandwidth may be relatively small while the data bandwidth at the receiver in the polarization domain is relatively large, which in certain embodiments, may provide a relatively large transfer of data. Certain embodiments of communication system 10 may be ideally suited for long distance communications, such as satellite communication links. With simple binary frequency shift keyed (FSK) source modulation, for example, an information density of over 200 bits-per-second-per-Hertz (bits/s/Hz) may be achievable; a density value that may be orders of magnitude greater than conventional modulation techniques. Thus in certain embodiments, more than 1 Megabit/second (Mb/s) data streams may be transferred in a 5 kHz bandwidth ultra high frequency (UHF) satellite channel using conventional bent-pipe satellite transponders permitting video communication where communication links using conventional modulation schemes may be limited to voice information. Using higher-order alphabets, even greater data densities may be possible in certain embodiments.

Transmitter 16 may include a modulator, amplifier, and a circular polarized antenna of any design. In certain embodiments, the modulator of transmitter 16 may perform a continuous frequency modulation over a small and relatively accurate range (or deviation) at a rate corresponding to the data rate. Certain embodiments of the transmitter 16 may modulate circular polarized signal in a manner such that the phase deviation in the radial velocity of the polarization vector may deviate at a specified slew rate. For example, it may be desired to limit the slew rate of the phase deviation in the radial velocity of the received circular polarized signal 14 for various reasons, including but not limited to, increased signal-to-noise ratio, and reduced undesired radiation emissions outside of the allocated frequency envelope. To accomplish this, transmitter 16 may be configured to limit the frequency shift rate (Hertz/second) of the circular polarized signal 14 such that the slew rate of the phase deviation exhibited at receiver 12 does not exceed specified limits.

Receiver 12 may be a wireless receiver operable to generate and process electrical signals from electro-magnetic signals. Receiver 12 may include two polarized feed structures 18a and 18b that are independently coupled to each of two sub-antenna structures 20 and a signal processor 22. In the particular embodiment shown, sub-antenna structures 20 are configured orthogonally relative to one another in a manner suitable for receiving circular polarized signal 14 from transmitter 16 and generating orthogonal signal components from the received circular polarized signal 14. Signal processor 22 receives these orthogonal signal components from polarized feed structures 18 and demodulates information from the received circular polarized signal 14 according to a phase deviation in the radial velocity of the polarization vector of the circular polarized signal 14.

Certain embodiments of sub-antenna structures 20 may include any type that recovers the instantaneous polarization vector 44 (See, e.g., FIGS. 2A and 2B) from a circular polarized signal 14. Certain embodiments of sub-antenna structures 20 may include polarized antenna structures that are oriented orthogonally relative to one another, such that each sub-antenna structure 20 receives circular polarized signal 14 at one-half of the received total power. Polarized sub-antenna structures of this type are often referred to as vertical and horizontal sub-antenna structures 20.

The phase deviation of the circular polarized signal may be determined from either one sub-antenna structure 20, or both sub-antenna structures 20. Due to possible polarization mismatch errors between the transmitter 16 and receiving sub-antenna structures 20, optimization of its signal-to-noise ratio, and better operation, the polarization phase of the received circular polarized signal 14 may be determined using signal components from both sub-antenna structures 20 in certain embodiments.

Each polarized feed structure 18a and 18b includes one or more filters 26a and 26b, a low noise amplifier 28a and 28b, a mixer 30a and 30b, an intermediate frequency amplifier 32a and 32b, and an analog to digital converter (ADC) 34a and 34b coupled as shown. Each mixer 30a and 30b mixes a local oscillator signal generated by local oscillator 36 and received through a divider circuit 38 to mix the received circular polarized signal 14 to a lower frequency using a super-heterodyne down mixing technique. Certain embodiments of polarized feed structure 18 may include more, fewer, or other types of components.

Signal processor 22 may include any device that compares signal components from both polarized feed structures 18 to determine a phase deviation in the radial velocity of the circular polarized signal 14. Signal processor 22 may be implemented in any suitable combination of hardware, firmware, and software. Additionally, signal processor 22 may be implemented in a single location or in a distributed fashion according to particular needs. Certain embodiments of signal processor 22 may include logic contained within a medium. Logic may include hardware, software, and/or other logic. The medium in which the logic is encoded may include a tangible medium. The logic may perform operations when executed by a processor configured in signal processor 22. Certain logic may include a computer program, software, computer executable instructions, and/or instructions capable being executed by the processor of signal processor 22. The logic may also be embedded within any other suitable medium without departing from the scope of the disclosure.

Certain conventional receivers that receive circular polarized signals typically recover signals by combining their vertical and horizontal polarization elements in a quadrature combiner. Signal processor 22, however, processes the two signal components from the orthogonal sub-antenna structures 20 separately. It is at this point where the frequency/amplitude domain and the polarization phase domain are crossed such that the frequency/amplitude domain frequency shift keyed signal becomes a polarization domain signal. In conventional communication links using circular polarized signals, the two signal components are combined such that only the magnitude of the carrier wave remains and the polarization rotation of the circular polarized signal 14 is lost. Using receiver 12, however, rotation information of polarization vector 44 (FIG. 2B) is preserved. In one embodiment, the receiver bandwidth may be high corresponding to the data modulation rate even though the signal in space is relatively narrowband in bandwidth. After sufficient amplification, signal processor 22 may accept in-phase and quadrature components just as with a typical demodulator to recover the data stream.

In operation, receiver 12 receives circular polarized signal 14 from transmitter 16 that has been frequency modulated with information. The circular polarized signal 14 has a polarization vector that rotates at a radial velocity proportional to the signal's frequency. The wireless receiver determines a phase deviation in the radial velocity of the polarization vector of the circular polarized signal 14 that has been modulated via a deviation in frequency at the transmitter. The receiver 12 may demodulate information from circular polarized signal 14 according to the determined phase deviation. Information that may be demodulated by receiver 12 is described in detail below.

Figure 2A:
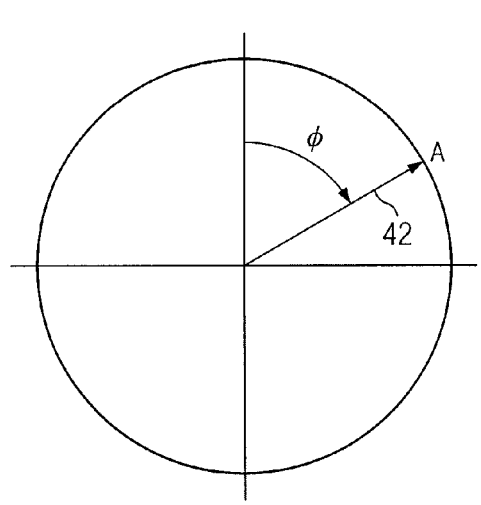
FIGS. 2A and 2B illustrate an example signal vector in the frequency/amplitude plane and a polarization vector in the polarization plane, respectively, that may be generated by the transmitter of FIG. 1.
Figure 2B:
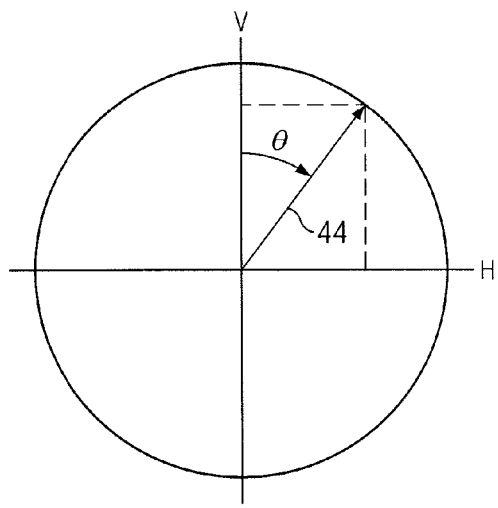

FIGS. 2A and 2B illustrate an example signal vector 42 in the frequency/amplitude plane and a polarization vector 44 in the polarization plane, respectively, that may be generated by transmitter 16 of FIG. 1. Operating in a frequency/amplitude plane as shown by signal vector 42, the traditional communications methods currently yield transfer densities versus bandwidth in the region of 1 to 3 bits-per-second-per-Hertz (bits/s/Hz). Thus, high data rate signals may require corresponding wide frequency bandwidths to transfer information. Another mechanism for modulating information using the polarization of a transmitted signal is shown as polarization vector 44.

Receiver 12 detects modulation using a phase deviation in the radial velocity of polarization vector 44, rather than using the frequency and amplitude of a radio frequency (RF) carrier to represent the data. The phase deviation generally refers to a deviation in the phase rate of change of the polarization vector of the transmitted circular polarized signal 14. Circular polarized signal 14 may be created by separate orthogonal feeds that combine to form a circular vector similar to the signal vector in the frequency/amplitude plane (FIG. 2A). At transmitter 16, and at a specific frequency, the emanating signal may have an arbitrary starting phase as shown (FIG. 2B).

Figure 3:
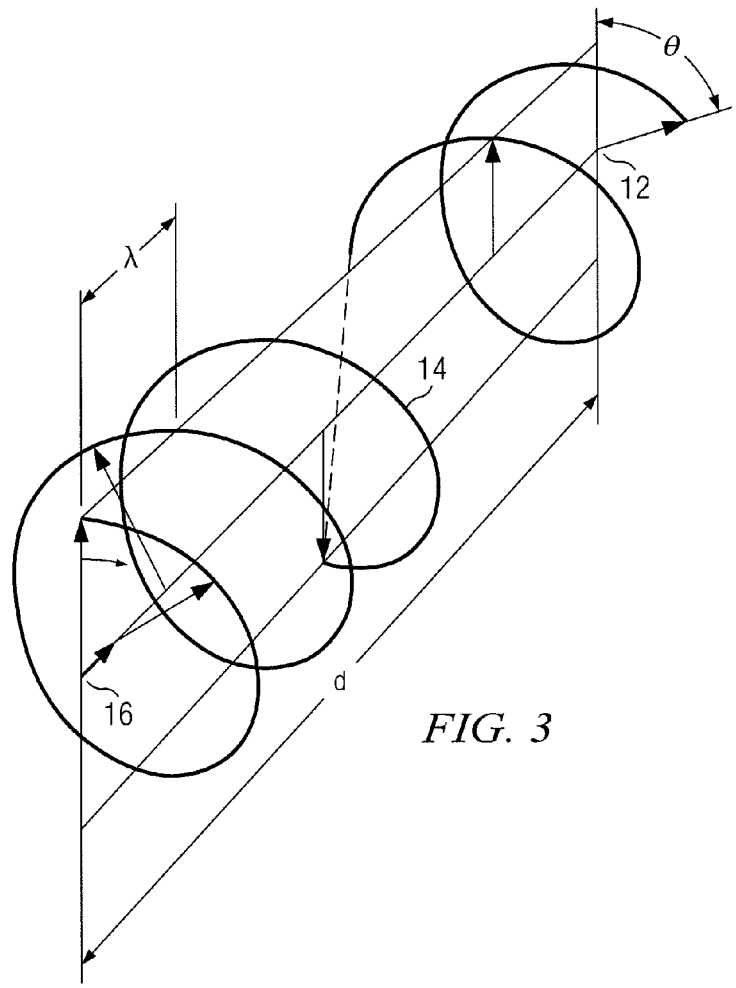
FIG. 3 illustrates example propagation from the transmitter to the receiver of the circular polarized signal of FIG. 1.

FIG. 3 illustrates example propagation from transmitter 16 to receiver 12 of the circular polarized signal 14 of FIG. 1. Circular polarized signal 14 starts with an arbitrary phase that in this particular graph is vertical (12 o'clock) and rotates 360 degrees for each wavelength toward receiver 12. Depending on the distance d and the frequency (1/γ), the signal will terminate at receiver 12 with a polarization phase angle θ relative to the initial phase. By modifying the transmitter 16 antenna to separately control the vertical and horizontal polarization components, the initial phase can be oriented to any value and therefore modulated to represent data. Receiver 12 detects the variation in the received signal with separate polarized feed structures 18 coupled to orthogonally configured sub-antenna structures 20. Signals from each polarized feed structure 18 may be processed by signal processor 22 to detect the resulting phase deviation to demodulate the modulated data. Circular polarized signal 14 rotates clockwise as it propagates toward receiver 12. This is commonly known as right hand circular polarization. In certain embodiments, a circular polarized signal 14 may have a counter-clockwise rotation commonly known as left hand polarization.

In conventional frequency/amplitude plane modulation techniques, the radiated circular polarized signal 14 propagates as shown in FIG. 3. However, the vertical and horizontal components are simply combined at the source and destination to only recover the magnitude and/or frequency of the polarization vector 44, thus throwing away information associated with its polarization phase. Frequency and phase information impressed at the transmitting source are replicated at the receiver. Conventional polarization rotation modulation schemes work as expected for a single radio-frequency (RF) carrier frequency that do not vary a significant amount. If the carrier frequency varies, however, the wavelength varies, and therefore the received polarization phase varies an amount in addition to the induced polarization phase modulated at its source. Unless the frequency variation is deterministic, therefore, the receiver of these conventional communication links cannot distinguish the source of the polarization phase change.

The wavelength of a radio-frequency propagating signal is:

$$\lambda = \frac{v}{f} \qquad 1$$

where λ = wavelength (meters)

v = velocity of the wave (meters/second)

f = frequency (Hz)

In air or vacuum, the velocity is the speed of light, leaving the more familiar:

$$\lambda = \frac{v}{f} \qquad 2$$

where λ = wavelength (meters)

c = speed of light (meters/second)

f = frequency (Hz)

For a distance d between the source and the destination, the number of wavelengths is:

$$\text{\# of wavelengths} = \frac{d}{\lambda} = \frac{d}{\left(\frac{c}{f}\right)} = \frac{df}{c} \qquad 3$$

By definition, there is 360 degrees of polarization vector 44 rotation-per-wavelength. Thus between the source and the destination the total phase rotation at frequency f is:

$$\text{Phase rotation (degrees)} = \frac{360 \, df}{c} \qquad 4$$

For a system modulating and controlling the source reference phase position, as the frequency varies between two end points, the destination phase changes by:

$$\begin{aligned}\text{Phase deviation (degrees)} &= \frac{360 \, df_1}{c} - \frac{360 \, df_2}{c} \\ &= \frac{360 \, d}{c}(f_1 - f_2) \\ &= \frac{360 \, d}{c}\Delta f\end{aligned} \qquad 5$$

Because the phase may deviate due to changes in the transmitted frequency, and the source of a phase deviation may not be easily distinguished between a frequency shift or a change in initial polarization phase, conventional polarization modulation schemes are often used at a single, fixed frequency. Thus, modulating the signal in both the polarization and frequency/amplitude domains independently may be difficult to accomplish using conventional polarization phase shift schemes.

Note in equation 5 that the polarization phase deviation depends on the frequency deviation and not on the absolute frequencies used. Thus, a relatively small change in frequency may be more important than the absolute frequency. In certain embodiments, the carrier frequency of circular polarized signal 14 should be several times the data rate frequency so that there is a dwell of several cycles at each extreme of the frequency deviation, allowing the signal processor 22 to recover the data timing in a relatively accurate manner. The cross domain modulation scheme according to the teachings of the present disclosure uses a phase deviation in the radial velocity of the polarization vector caused by frequency deviation at the source as the means to communicate. In certain embodiments, binary shifting between two different frequencies at transmitter 16 generates a frequency shift keyed (FSK) source signal that results in a binary phase shift keyed (BPSK) signal in the polarization domain at receiver 12 with the frequency deviation related to the phase shift by equation 5.

Figure 4:
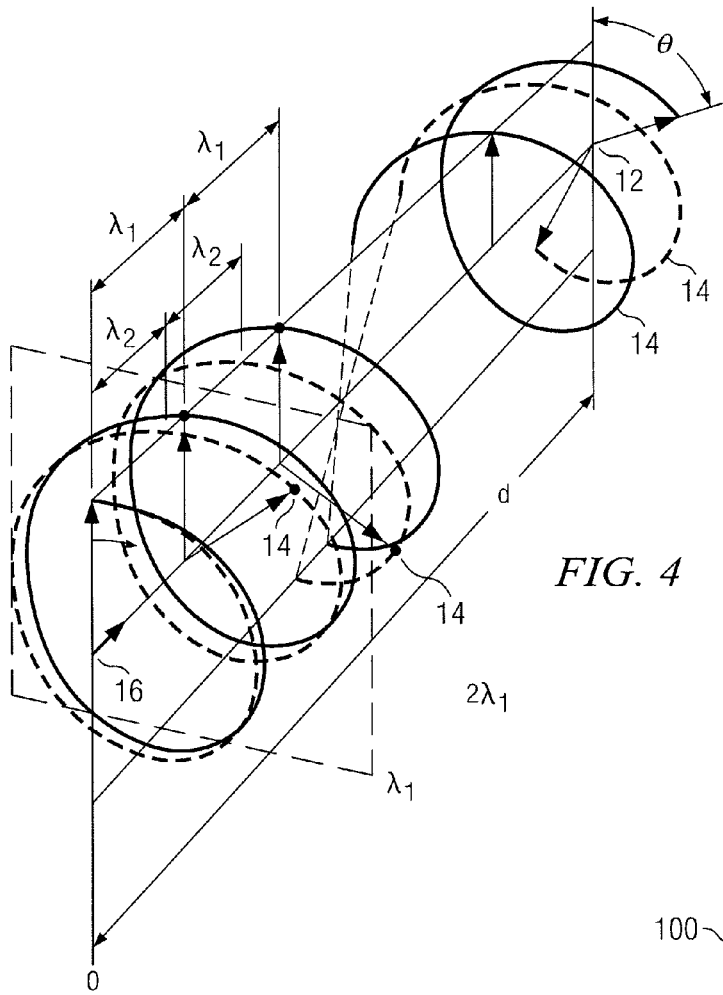
FIG. 4 illustrates possible dependency of a phase deviation of the circular polarized signal detected at the receiver on a distance of the receiver from the transmitter of FIG. 1.

FIG. 4 illustrates possible dependency of a phase deviation of circular polarized signal 14 detected at receiver 12 on a distance of receiver 12 from transmitter 16 of FIG. 1. Using communication system 10, the cross domain modulation scheme is based upon the polarization vector 44 rotating one turn-per-wavelength (electrical distance), which may or may not be fixed. As shown in equation 2, the wavelength of circular polarized signal 14 is inversely proportional to frequency, which is the parameter of circular polarized signal 14 that may be varied by transmitter 16. For example, transmitter 16 may be configured a quantity of ten wavelengths from receiver 12 at a frequency $f_1$. Increasing the frequency by 11.1 percent to frequency $f_2$ causes the wavelength ($\gamma$) to decrease by 1/1.111=0.90 such that the ten wavelengths of the signal only reaches 90 percent to receiver 12. An additional 1.11 wavelengths is needed, or 1.11*360=400 degrees of rotation to reach receiver 12.

Now, consider a similar system, but the initial separation of transmitter 16 to receiver 12 is one-hundred wavelengths at frequency $f_1$, or ten times as far. At frequency $f_2$, one-hundred wavelengths reach 90 percent of the way, but now 11.111 wavelengths are needed at frequency $f_2$ to complete the span, or 11.111*360=4000 degrees of rotation. There is therefore a linear distance relationship to the polarization phase rotation.

As shown, the distance between the first two revolutions of the polarization vector 44 at frequency $f_1$ set a reference phase and the phase rotation at frequency $f_2$ shows the relative phase at those reference planes.

As the physical distance between transmitter 16 and receiver 12 gets longer, the amount of frequency change at transmitter 16 to accomplish a given polarization phase change at receiver 12 is reduced. From a modulation standpoint in the frequency/amplitude domain, this means that circular polarized signal 14 becomes narrowband and loses the typical 'sin(x)/x' characteristic of wideband modulation. For an frequency shift keyed (FSK) source created by modulation of an oscillator, the power spectral density for a signal modulated with a small frequency deviation ratio (frequency change divided by bit rate) may have a shape resembling a high-Q resonance curve with a 3-dB bandwidth given by:

$$3 \text{ dB bandwidth} = \frac{\pi}{2} f_B D^2, \qquad 6$$

where $f_B$ = bit rate (Hz), and $$D = 2\Delta f / f_B,$$

where $\Delta f$ = frequency deviation and $D < 0.5$.

Rearranging the above statements results in the following:

$$\begin{aligned}3 \text{ dB bandwidth} &= \frac{\pi}{2} f_B \left(\frac{2\Delta f}{f_B}\right)^2 \\ &= \frac{\pi}{2}\left(\frac{4\Delta f}{f_B}\right) \\ &= 2\pi \frac{\Delta f^2}{f_B}\end{aligned} \qquad 7$$

For a case in which the cross domain modulation is driving the frequency change ($\Delta f$) down and the higher bit rate is increasing frequency $f_B$, the bandwidth decreases. In certain embodiments, this may have a desired effect of increasing the bit density in the frequency/amplitude domain. Using normal demodulation methods, however, this type of signal may be effectively difficult to detect. Narrowband filtering schemes that may be used to separate the two modulating frequencies generally become so narrow that they cannot respond to changes occurring at relatively high data rates. With cross domain modulation, however, the circular polarized signal 14 appears in the polarization domain as a phase modulation of wide occupied bandwidth, which in certain embodiments, may be detectable in a similar manner to a binary phase shift keyed (BPSK) modulated signal.

As an example, communication system 10 may be implemented on a geosynchronous satellite link where the distance between transmitter 16 and receiver 12 may be approximately 40,000 kilometers. At this distance, the phase sensitivity may be approximately 48 degrees/Hertz, meaning that a 3.75 Hz frequency deviation at transmitter causes an approximate 180 degree polarization phase shift at receiver 12. At this relatively long distance, the occupied bandwidth used by circular polarized signal 14 is reduced and the bit density is increased. There may be some concern that the transmitted carrier frequency noise or stability could overwhelm the desired signal.

However, the modulated rate is much higher frequency than the carrier noise, and appropriate filtering should permit the desired signal to be recovered.

In certain instances, the cross domain modulation scheme provided by communication system 10 may be susceptible to various forms of interference in the polarization domain. Frequency and/or phase modulated information modulated onto circular polarized signals 14 may create polarization domain interfering signals. In certain embodiments, various techniques may be implemented on communication system 10 to filter this interference including, increased circular polarized signal 14 source power to improve the signal to interference ratio, discriminating the phase deviation rate of change, and/or restricting the phase deviation to a specified amount that is less than 360 degrees (e.g. 180 degrees) according to the distance between transmitter 16 and receiver 12. In certain embodiments, sub-antenna structures 20 may be configured to have a relatively narrow beamwidth for rejecting off-boresight interference from stray signals. In certain embodiments, communication system 10 may be implemented with spreading codes and other similar logical coding techniques to mitigate interfering signals.

In certain cases, the distance between transmitter and receiver 12 may change continually during operation. The radial velocity of circular polarized signal 14 per its wavelength, therefore, may be induced with noise due to frequency deviation caused by movement of receiver 12 relative to transmitter 16. This frequency deviation, however, may be generally similar to a doppler frequency shift induced from motion in the frequency/amplitude domain.

In certain embodiments therefore, relative rates of change, repeated synchronization messages (ambles), and similar schemes in the next higher level waveform design may be used to discriminate these motion effects. As an example, receiver 12 may be moved at a 400 miles-per-hour (MPH) relative to transmitter 16. At this movement, the induced phase may be approximately 4.3 degrees-per-microsecond, a value that may be small relative to the 180 degree induced change per microsecond at the 1 megabits/second data rate. Thus, the motion effect may be noise-like as long as the error effects are not allowed to accumulate over time in certain embodiments.

The examples above were described for binary modulation schemes with two-state alphabets. In certain embodiments, m-ary schemes with multiple states and higher order alphabets may also be possible and thus may yield even higher densities of data bandwidth. For example, in certain embodiments, another polarization phase modulation scheme referred to as continuous phase modulation (CPM) may be implemented by controlling the frequency change and shaping the frequency deviation of circular polarized signal 14. In certain embodiments, another polarization phase modulation technique referred to as quadrature phase shift keyed (QPSK) demodulation may be implemented by establishing 0°, 90°, 180°, and 270° phase shifts at receiver 12.

In certain embodiments, signal processor 22 may demodulate information from transmitted circular polarized signal 14 according to its quantity of revolutions. Polarization domain phase rotation occurs through the simple physics of transmitted polarization variations due to wavelength changes; it may not be the result of high speed electronics driving the polarization phase. The polarization phase simply follows the frequency change as described with reference to equation 5. For the example in which the distance between transmitter 16 and receiver 12 is approximately 40,000 kilometers, the frequency deviation to achieve 180 degrees phase shift was described as 3.75 Hz. In fact, the frequency shift is actually 3.75*N Hertz, where N is an odd integer. As the frequency continues to deviate, the polarization vector 44 will continue to rotate past the first turn through multiple turns at the same rate. Thus, signal processor 22 may demodulate information from the received circular polarized signal according to a quantity of rotations of the polarization vector 44 past a reference established in a preamble synchronization message.

For a system having up to 1023 (10 bits) rotations-per-symbol, each bit period would have a phase change of 0 degrees for a transmitted word of zero, 360 degrees for a word value of one, up to 360*1023=368,280 degrees for a word value of 1023. For the example described above in which the distance between transmitter 16 and receiver 12 is approximately 40,000 kilometers, a frequency shift of 7672.5 Hertz in 3.75 Hertz steps may be all that is needed. Each transmitted symbol transfers ten bits of information, significantly boosting the bit density. Estimating a bandwidth of approximately 9000 Hertz at 1 million symbols-per-second (MSPS) and ten bits-per-symbol, the system may implement 1,111 bits/s/Hz.

In certain embodiments, counts from 0, 2, 5 . . . 3,072 to the phase rotation counter may be allocated to counteract doppler shift effects, permitting each of 1024 states to have a nominal value with a plus or minus one count error built in. Ten bits-per-word may still be transferred such that the modulation deviation increases to only approximately 23 kilo-Hertz. In this particular embodiment, signal processor 22 may be configured to count at a rate sufficient to support this relatively high data rate.

The embodiments described above may be directed to cross domain modulation from variation in frequency to variations in phase deviation in the radial velocity of the polarization vector 44. In certain embodiments, it may be possible to modulate the polarization of the circular polarized signal 14 with a polarization phase and demodulate a frequency variation at receiver 12. In some respects, this cross domain modulation scheme may be relatively less detectable and reduce to probability of interception.

Figure 5:
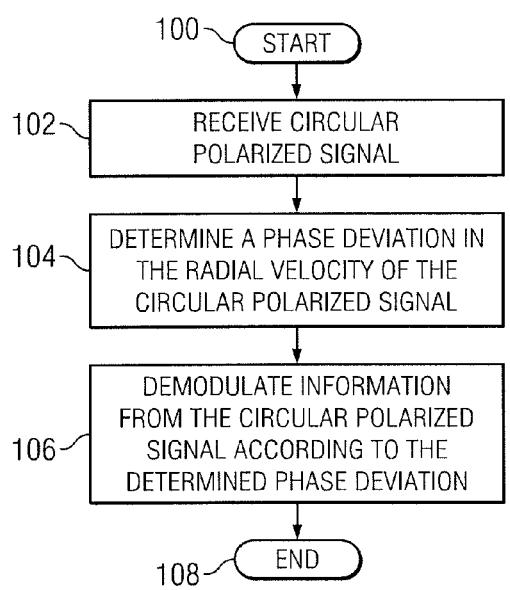
FIG. 5 illustrates an example method of the cross domain modulation scheme of FIG. 1.

FIG. 5 illustrates an example method of the cross domain modulation scheme of FIG. 1. For example, the method may provide a technique for recovering information from a circular polarized signal using the example receiver of FIG. 1. In act 100, the method is initiated.

In act 102, receiver 12 receives a circular polarized signal having a polarization vector that rotates at a radial velocity. Receiver 12 may be any type that that is operable to detect instantaneous deviations in the phase of the polarization vector of the circular polarized signal. Certain embodiments of receiver 12 may include at least two sub-antenna structures that are configured orthogonally relative to one another.

In act 104, receiver 12 determines a phase deviation in the radial velocity of the polarization vector. The phase deviation may be a result of a frequency deviation of the circular polarized signal that is generated by transmitter 16. The frequency deviation may modulate information onto circular polarized signal 14. In certain embodiments, a frequency deviation of circular polarized signal 14 may include a binary phase shift keyed (BPSK) modulation, a continuous phase modulation (CPM) modulation, or a quadrature phase shift keyed (QPSK) modulation of the radial velocity of the polarization vector 44.

Certain embodiments of circular polarized signal 14 may be frequency modulated by transmitter 16 such that the slew rate of the phase deviation of the polarization vector is maintained at or below a specified limit. For example, the rate of frequency deviation may be limited by the transmitter 16 such that the rate of phase deviation of the polarization vector is limited to a specified slew rate.

In act 106, receiver 12 demodulates information from the circular polarized signal according to the determined phase deviation. Information derived from the demodulated signal may be any suitable type. In certain embodiments, information may include data that has been modulated by transmitter 16 in a manner as described above.

In certain embodiments, information demodulated by receiver 12 may include identification of a particular transmitter 16 from among multiple transmitters that may transmit circular polarized signals. Because of the relatively high sensitivity provided due to sensing relatively small frequency changes through phase deviation, the cross domain modulation scheme may be useful for evaluating potential signatures or undesired unintended repetitive outputs unique to a specific transmitter such that the source of a message could be determined. This method would effectively measure low level characteristics of a radio's reference oscillator, which may be generally stable over time.

In certain embodiments, information demodulated by receiver 12 may include a physical distance of receiver from transmitter 16. From equation 5, the phase deviation of the polarization vector is related to frequency change, distance, and the speed of light. In other words, the phase deviation of the polarization vector may be related to the speed of the circular polarized signal through its transmission media. If transmitter 16 sends a message including a frequency shift keyed (FSK) modulation between known reference frequencies, the distance would be determined by measuring the phase shift at receiver 12.

By having three different frequencies and measuring the polarization phase shift between two different pairs of frequencies, two equations in two unknowns may be developed, allowing the solution for both distance and propagating speed. The distance measuring technique would, therefore, determine a distance of receiver 12 from transmitter 16. Having two spatially separated transmitters 16 would permit two dimensional determination of the location of receiver 12 with one uncertainty, and three transmitters 16 may alleviate the one uncertainty in a manner similar to distance measurement using a global positioning system (GPS). In certain embodiments, communication system 10 may be implemented as a distance measuring system in locations where there is no or poor global positioning system service, including applications in planetary exploration.

In act 108, the process ends.

Modifications, additions, or omissions may be made to the method without departing from the scope of the disclosure. The method may include more, fewer, or other acts. For example, receiver 12 may initiate a communication session with transmitter 16 by receiving known preamble messages from transmitter 16, determining one or more operating parameters from the known preamble messages, such as distance d between transmitter 16 and receiver 12, doppler shift effects due to movement of transmitter 16 relative to receiver 12, and/or modulation rate to form a slew rate of the phase deviation that remains within acceptable limits. These determined operating parameters may be transmitted back to transmitter 16 via a complementary communication system or other type of communication link in handshake fashion to establish the operating parameters that may be used by the communication session.

Although the present disclosure has been described with several embodiments, a myriad of changes, variations, alterations, transformations, and modifications may be suggested to one skilled in the art, and it is intended that the present disclosure encompass such changes, variations, alterations, transformation, and modifications as they fall within the scope of the appended claims.

What is claimed is:

1. A wireless communication system comprising:
a wireless receiver comprising a first channel and a second channel, the wireless receiver operable to:
receive, using the first channel and the second channel, a first signal component and a second signal component, respectively, of a circular polarized signal from a remote transmitter, the circular polarized signal having a polarization vector that rotates at a radial velocity, the first signal component being orthogonal to the second signal component;
determine a phase deviation in the radial velocity of the polarization vector based upon frequency deviation, the phase deviation caused by a frequency deviation of the circular polarized signal generated by the remote transmitter of the circular polarized signal; and
demodulate data from the circular polarized signal according to the determined phase deviation, the data being modulated onto the circular polarized signal according to the frequency deviation.

2. A wireless communication system, comprising:
a wireless receiver operable to:
receive a circular polarized signal having a polarization vector that rotates at a radial velocity;
determine a phase deviation in the radial velocity of the polarization vector of the circular polarized signal based upon frequency deviation that was modulated via a deviation in frequency by a transmitter; and
demodulate information from the circular polarized signal according to the determined phase deviation.

3. The wireless communication system of claim 2, wherein the receiver is operable to:
demodulate information comprising data that has been modulated onto the circular polarized signal according to the frequency deviation.

4. The wireless communication system of claim 2, wherein the circular polarized signal comprises one or more of the following:
a binary phase shift keyed (BPSK) modulation; a continuous phase modulation (CPM) modulation; and
a quadrature phase shift keyed (QPSK) modulation.

5. The wireless communication system of claim 2, wherein the transmitter comprises a plurality of transmitters operable to transmit a plurality of the circular polarized signals, the receiver operable to: demodulate information comprising identification of the transmitter from among the plurality of transmitters that is transmitting the circular polarized signal.

6. The wireless communication system of claim 2, wherein the receiver is operable to: determine a quantity of revolution shifts of the polarization vector and demodulate information from the circular polarized signal according to the quantity of revolution shifts.

7. The wireless communication system of claim 6, wherein the receiver is operable to: determine a distance between the receiver and the transmitter according to the determined quantity of revolution shifts.

8. The wireless communication system of claim 2, wherein the transmitter is configured to limit a frequency shift rate of the circular polarized signal such that a slew rate of the phase deviation does not exceed a specified limit.

9. The wireless communication system of claim 2, wherein the receiver comprises a first channel and a second channel operable to receive a first signal component and a second signal component, respectively, of the circular polarized signal, the first signal component being orthogonal to the second signal component.

10. A wireless communicating method comprising:
- receiving a circular polarized signal having a polarization vector that rotates at a radial velocity;
- determining a phase deviation in the radial velocity of the polarization vector based upon frequency deviation, the phase deviation caused by a frequency deviation of the circular polarized signal generated by a remote transmitter of the circular polarized signal; and
- demodulating information from the circular polarized signal according to the determined phase deviation.

11. The wireless communicating method of claim 10, further comprising:
- demodulating information comprising data that has been modulated onto the circular polarized signal according to the frequency deviation.

12. The wireless communicating method of claim 10, wherein the circular polarized signal comprises one or more of the following:
- a binary phase shift keyed (BPSK) modulation; a continuous phase modulation (CPM) modulation; and
- a quadrature phase shift keyed (QPSK) modulation.

13. The wireless communicating method of claim 10, further comprising:
- demodulating information comprising identification of the transmitter from among a plurality of transmitters that are transmitting a plurality of the circular polarized signals.

14. The wireless communicating method of claim 10, further comprising:
- determining a quantity of revolution shifts of the polarization vector; and
- demodulating information from the circular polarized signal according to the quantity of revolution shifts.

15. The wireless communicating method of claim 14, further comprising:
- determining a distance between the receiver and the transmitter according to the determined quantity of revolution shifts.

16. The wireless communicating method of claim 10, further comprising:
- limiting, by the transmitter, a frequency shift rate of the circular polarized signal such that a slew rate of the phase deviation does not exceed a specified limit.

17. The wireless communicating method of claim 10, further comprising:
- receiving a first signal component and a second signal component of the circular polarized signal using a receiver comprising a first channel and a second channel, respectively, the first signal component being orthogonal to the second signal component.

* * * * *